United States Patent [19]

Antos et al.

[11] Patent Number: 5,078,092

[45] Date of Patent: Jan. 7, 1992

[54] FLASH VAPORIZER SYSTEM FOR USE IN MANUFACTURING OPTICAL WAVEGUIDE FIBER

[75] Inventors: A. Joseph Antos; Michael S. Dobbins; Victor E. Olson, III, all of Wilmington, N.C.; Dale R. Powers, Painted Post, N.Y.; Francis W. Voorhees, Wilmington, N.C.

[73] Assignee: Corning Incorporated, Corning, N.Y.

[21] Appl. No.: 456,118

[22] Filed: Dec. 22, 1989

[51] Int. Cl.$^5$ .............................................. C23C 16/00
[52] U.S. Cl. ..................................... 118/726; 427/166; 65/3.12
[58] Field of Search ..................... 118/726; 65/3.12; 427/166

[56] References Cited

U.S. PATENT DOCUMENTS

| | | | |
|---|---|---|---|
| 4,173,305 | 11/1979 | Blankenship | 239/79 |
| 4,314,837 | 2/1982 | Blanckenship | 65/3.12 |
| 4,230,744 | 10/1980 | Blankenship | 427/163 |
| 4,276,243 | 6/1981 | Blanckenship | 261/128 |
| 4,314,837 | 2/1982 | Blankenship | 65/3.12 |
| 4,529,427 | 7/1985 | French | 427/163 |

FOREIGN PATENT DOCUMENTS

| | | |
|---|---|---|
| 0058571 | 8/1982 | European Pat. Off. . |
| 0299753 | 1/1989 | European Pat. Off. . |
| 58-125633 | 7/1983 | Japan . |
| 8707848 | 12/1987 | PCT Int'l Appl ....... WO87/07848 |

Primary Examiner—Richard Bueker
Attorney, Agent, or Firm—K. McNeill Taylor, Jr.

[57] ABSTRACT

A system for delivering a liquid reactant at high flow rates to an oxidation/flame hydrolysis glass soot deposition site. A first liquid only reactant is delivered to a flash vaporization chamber to form a thin film and mixed with oxygen after vaporization. Additional vaporized reactants are thereafter mixed with the vaporized first liquid prior to delivery to an oxidation/flame hydrolysis burner to form a glass soot outer cladding layer on a soot preform. The soot preform is subsequently fused to form a high quality glass blank for drawing into optical fiber.

27 Claims, 2 Drawing Sheets

FLASH VAPORIZER SYSTEM FOR USE IN MANUFACTURING OPTICAL WAVEGUIDE FIBER

BACKGROUND OF THE INVENTION

The present invention relates to a flash vaporizer for delivering vaporized reactants to an oxidation/flame hydrolysis glass soot deposition system, and particularly to improved delivery and flash vaporization chamber means for vaporizing $TiCl_4$ at a controlled rate as a thin film.

In order to enhance the fatigue resistance or other mechanical properties of an optical fiber, or to effect a change in the index of refraction of a vapor deposited soot preform for the optical fiber, the chemical composition of the vapors which are reacted to form the deposited soot may be varied. In the soot deposition process, the vapor mixture is oxidized/hydrolyzed at a burner to form a glass soot which is subsequently fused to form a high quality glass. Typically, $SiCl_4$ is the primary vapor constituent. One or more additional vapors can be supplied to the oxidation/flame hydrolysis burner, the one or more vapors comprising chemical precursors of dopants whose presence affects the properties of the glass being formed.

In order to form a soot preform having generally consistent properties, and to assure an even distribution of the glass forming soot, it is necessary to supply the burner with a substantially constant flow of vaporized source material entrained in a carrier gas, such as $O_2$. Accordingly, systems have been devised for controlling the carrier gas flow and the rate at which source material is vaporized and entrained into the carrier gas.

The reactant flow is typically measured in the vapor state. Alternative systems have been disclosed which meter the reactants in their liquid state, and thereafter vaporize or nebulize the reactants prior to their introduction into an oxidation/flame hydrolysis burner.

U.S. Pat. No. 4,173,305, issued on Nov. 6, 1979 and U.S. Pat. No. 4,230,744 issued on Oct. 28, 1980, disclose a system for precisely controlling liquid source materials and delivering the liquid to a mixer and nebulizer followed by delivery to an oxidation/flame hydrolysis burner. Each source material is maintained in liquified form within a reservoir and the liquid is transferred by means of an individually controlled metering pump to a mixing stage and a nebulizing stage. Oxygen is delivered to the nebulizer through a mass flow controller to be intermixed with the liquid reactants during the nebulizing stage. The nebulized vapors are delivered to an oxidation/flame hydrolysis burner. An $O_2$ carrier gas is also introduced into the burner prior to being conveyed to the discharge means.

U.S Pat. No. 4,314,837, issued on Feb. 9, 1982 to M. G. Blankenship, discloses a method for delivering vapor source materials to an oxidation/flame hydrolysis burner. The Blankenship system comprises first and second enclosed reservoirs, each containing a liquid reactant which is a precursor of a dopant to be included in the soot preform. Each reservoir comprises heating means to heat the liquid contained therein to a temperature sufficient to maintain a predetermined minimum vapor pressure. Coupled to each reservoir is a mass flow controller for delivering vapors disposed within each reservoir at a controlled flow rate. After passage through the mass flow controller the vapors are combined with an $O_2$ carrier gas prior to being conveyed to the burner means. A significant problem associated with the aforementioned system is the individual controlled metering means coupled to each reservoir. The mass flow controller is inoperable with liquids having a high boiling point.

U.S. Pat. No. 4,529,427, issued on July 16, 1985 to W. G. French, discloses a method for delivering vaporous reactants to a vapor deposition means, in which the reactants are vaporized in a flash evaporation chamber. The liquid reactants are supplied to the flash evaporation chamber by metering pumps. Oxygen is also supplied to the flash evaporation chamber and intermixed with the vaporized reactants prior to delivery to the vapor deposition means. Although the liquid reactants are delivered to the flash evaporating chamber in controlled amounts, the liquid is sprayed onto a heating surface whereby immediate vaporization occurs, creating nucleate or film boiling. Although this method does avoid the metering of vaporized gases, the hot spots created in the flash evaporation chamber and the introduction of a carrier gas induce pressure oscillations.

The system described in Blankenship, U.S. Pat. No. 4,314,837 is constrained by the limits in temperatures and flow rates at which it could operate. The other prior art methods have suffered from various disadvantages, the most limiting of which has been the presence of pressure oscillations, due to nucleate or film boiling and due to the introduction of the carrier gas into the flash vaporization chamber.

In a prior art system developed by the assignee of the applicants, liquid $TiCl_4$ was vaporized in a flash vaporizer. A rod in cylinder configuration was utilized with a gap between the rod and cylinder of approximately 0.040 inch, and $O_2$ was supplied to the flash vaporizer along with liquid $TiCl_4$. The flash vaporizer was fed by a ¼ inch delivery tube. The $TiCl_4$ stream accumulated in the flash vaporizer, resulting in insufficient heat transfer. The gap width and liquid $TiCl_4/O_2$ flow were such that an uniform thin film was not created, resulting in pressure oscillations. The temperature in this configuration was maintained at about 220° C. to about 260° C., which is well above the boiling point of $TiCl_4$, 136° C., resulting in nucleate boiling of $TiCl_4$. Unacceptable pressure oscillations occurred due the introduction of $O_2$ into the flash vaporizer and nucleate boiling of the liquid $TiCl_4$.

To overcome these disadvantages and others, in the present invention a first liquid reactant is delivered to the flash vaporization chamber to form a thin film, vaporized in the flash vaporizer, and mixed with oxygen after vaporization. Thereafter additional vaporized reactants are mixed with the vaporized first liquid prior to delivery to an oxidation/flame hydrolysis burner.

It is therefore an object of the present invention to control the temperature within the flash vaporization chamber to prevent nucleate boiling of the liquid which leads to pressure oscillations in the vapor flow.

Another object of the present invention is to provide an improved system for delivering reactants at high flow rates to an oxidation/flame hydrolysis burner for glass soot deposition.

Another object is to provide a liquid only flash vaporization chamber in which the flow of unvaporized liquid is undisturbed by vapor exiting the flash vaporization chamber.

Another object is to provide a method to reduce dopant concentration variations resulting from the use of pressurized gas to move liquid TiCl$_4$ through the pressure detection means to the flash vaporization chamber.

SUMMARY OF THE INVENTION

The foregoing objects are achieved by providing a flash vaporizer for delivering vaporized reactants to an oxidation/flame hydrolysis glass soot deposition system. The system comprises improved delivery means to deliver liquid TiCl$_4$ at a controlled flow rate to form a thin film onto the heating surface within the flash vaporization chamber. Means are provided for heating liquid TiCl$_4$ within the flash vaporization chamber to a temperature below the temperature where nucleate or film boiling occurs. Means are also provide for intermixing the vaporized TiCl$_4$ with vaporized SiCl$_4$ and O$_2$, followed by delivery to a vapor deposition site.

DETAILED DESCRIPTION

Figure 1:
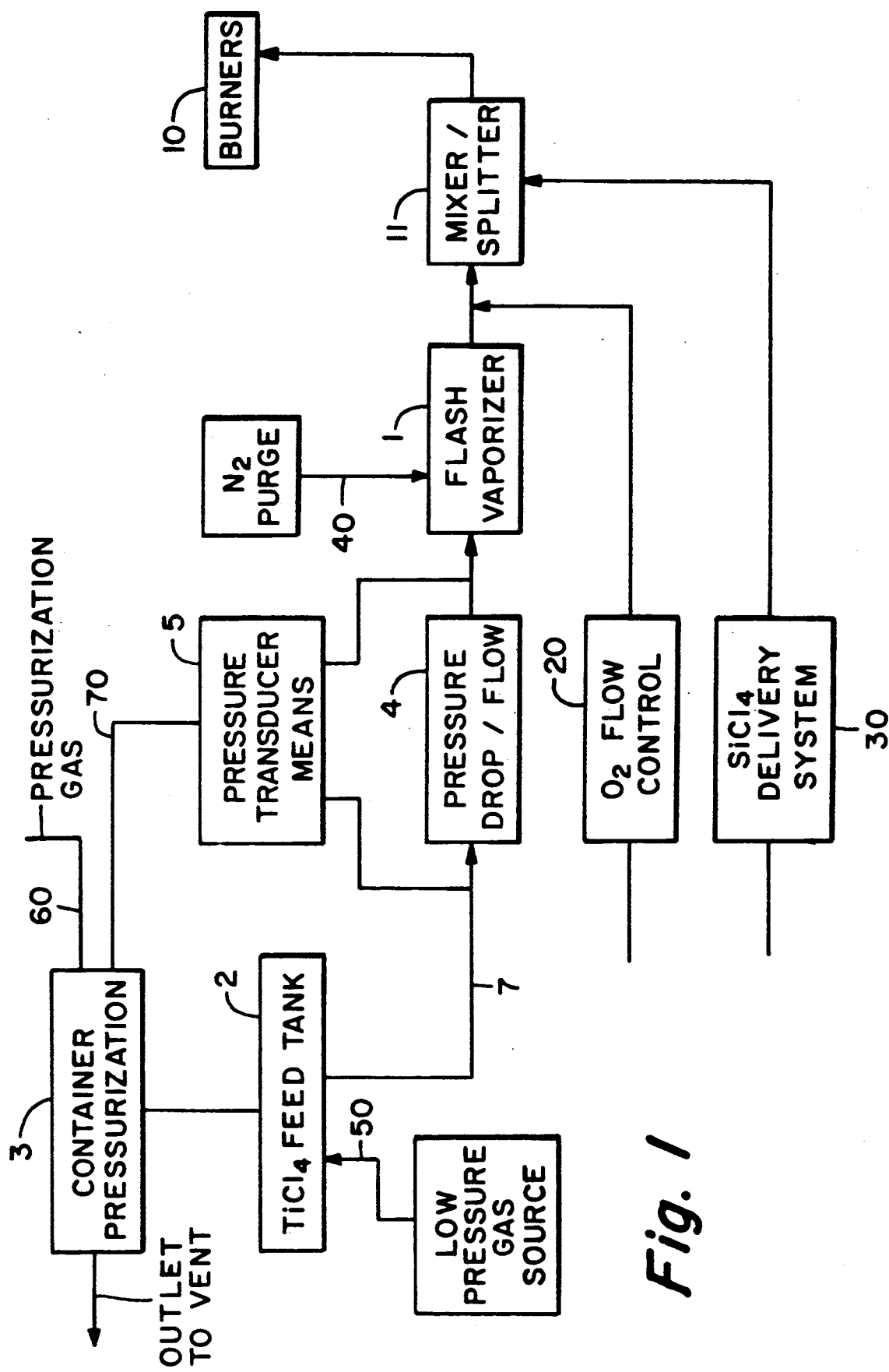
FIG. 1 is a block diagram of the system constructed in accordance with the present invention.

FIG. 1 illustrates a supply of liquid TiCl$_4$ in TiCl$_4$ container 2 connected to flash vaporization chamber 1, a flow control means 20 for providing a metered flow of O$_2$, and a SiCl$_4$ delivery system for providing a metered flow of SiCl$_4$ vapors. The TiCl$_4$ vapors are intermixed with O$_2$ after leaving flash vaporization chamber 1, and these vapors are thereafter intermixed with SiCl$_4$ vapors within mixer 11. This mixture is thereafter delivered to oxidation/flame hydrolysis burner 10.

Liquid TiCl$_4$ is supplied to chamber 1 from TiCl$_4$ container 2 by supply line 7. TiCl$_4$ container 2 is pressurized by container pressurization control means 3. Pressure drop/flow device 4 is an orifice or venturi that produces a specific pressure drop as a function of flow rate. Pressure transducer means 5, connected between TiCl$_4$ container 2 and flash vaporization chamber 1, measures the pressure drop across pressure drop/flow device 4, and converts the pressure drop into a control signal. The pressure control signal is provided in a feedback link 70 to pressurization means 3 in response thereto. Liquid TiCl$_4$ may also be supplied to chamber 1 by metering pumps, not shown, with precise fluid delivery characteristics. For example, dual piston or gear metering pumps, which are adapted to deliver controlled quantities of a liquid, coupled between TiCl$_4$ container 2 and flash vaporization chamber 1 would be further embodiment of the present invention. Other suitable liquids may be effectively vaporized by our inventive system, including but not limited to POCl$_3$, AlBr$_3$, and (—SiO(CH$_3$)$_2$—)$_4$.

Figure 2:
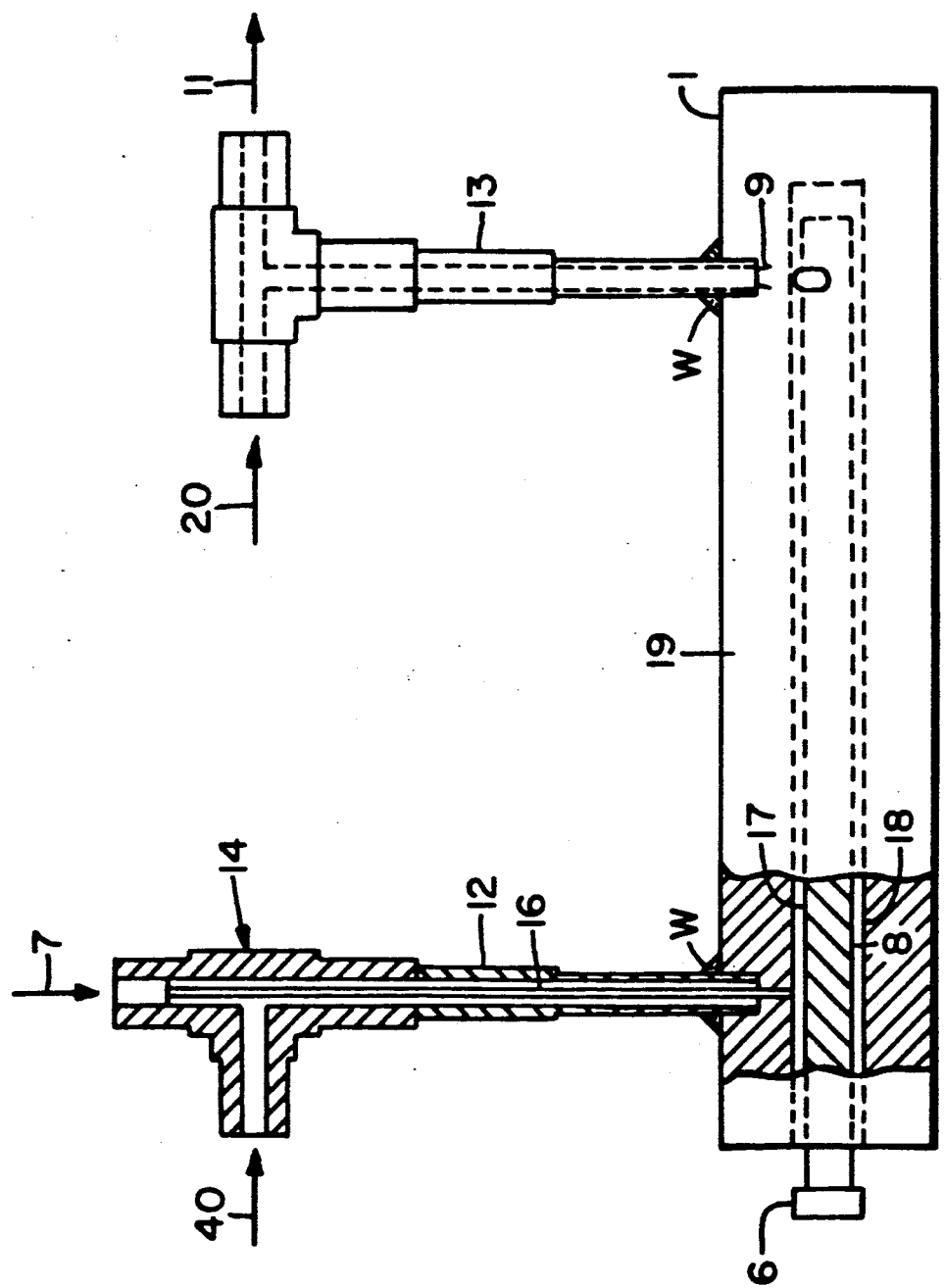
FIG. 2 is a partial cross sectional view of the flash vaporization chamber.

Referring now to FIG. 2, liquid TiCl$_4$ is delivered to flash vaporization chamber 1 by a vertical tube 16 within outer tube 12 directly onto inner surface 17 of heating element 6, which is formed within flash vaporization chamber 1. The liquid is fed into the top of tube 16 from feed line 7 at a controlled flow rate and is delivered to form a thin film directly onto inner surface 17, resulting in a smooth, oscillation-free vaporization. Tube 16 may comprise a 1/16th inch inner diameter tube coaxially mounted within an ⅛th inch inner diameter vertical tube 12, connected to an ⅛th inch inner diameter Tee and tubing 14 for delivering liquid TiCl$_4$ directly onto inner surface 17 as a thin film. The gap between the end of tube 16 and inner surface 17 was approximately 0.040 inch to maintain a continuous flow of liquid TiCl$_4$ onto inner surface 17. In alternative embodiments, liquid TiCl$_4$ may be wicked down to inner surface 17 by angling the end of tube 16 to inner surface 17 or bridging the gap with a wire or wire mesh extending from tube 16 to inner surface 17. Outer heating surface 18 is maintained at a constant temperature to prevent recondensation of liquid TiCl$_4$.

We have found that the mixing of gas and liquid before the flash evaporation chamber results in unacceptable pressure oscillations. The oxygen supplied to flow control 20 is preheated in a separate preheater, not shown. Thereafter the O$_2$/TiCl$_4$ vapor mixture is combined with SiCl$_4$ vapors in mixer 11, located between flash vaporization chamber 1 and burners 10, which may be any suitable number of burners, preferably 1-6 burners. The flow rate was preferably 2-3 grams per minute per burner. Oscillations are substantially eliminate by mixing O$_2$ with vaporized TiCl$_4$ after vaporizer exit 9.

The delivery of preheated oxygen to mixer 11 prevents TiCl$_4$ condensation when TiCl$_4$ and O$_2$ are mixed in mixer 11. A SiCl$_4$ delivery system 30 delivers vaporized SiCl$_4$ to be intermixed with vaporized TiCl$_4$ and preheated O$_2$ within mixer 11. After the mixing stage the vapors are delivered to an oxidation/flame hydrolysis burner 10 to form a glass soot outer cladding layer on a soot preform which is subsequently fused to form a high quality glass blank for drawing into optical fiber. The process for manufacturing such optical fibers and their structure and properties is described in detail in copending Backer et al. U.S. patent application Ser. Nos. 456,140 and 456,141, which are being filed concurrently herewith and which are incorporated herein by reference.

Flash vaporization chamber 1 is heated by heating element 6 and chamber cylinder 19. Chamber cylinder 19 may comprise several different configurations, for example a rod in cylinder or paired parallel flat plates. The temperature of heating element 6 is maintained below the temperature where nucleate or film boiling of the liquid occurs. For TiCl$_4$, the temperature of heating element 6 is about 166° C. which is about 30° C. above the boiling point of TiCl$_4$, 136° C.

To maintain a thin film of liquid TiCl$_4$ on inner surface 17 of heating element 6, the gap width between rod and cylinder or paired parallel flat plates must be of sufficient volume to allow the vaporized TiCl$_4$ to reach operating pressure within a reasonable time, for example thirty seconds. Specifically, the vapor must reach a sufficiently high pressure to ensure that it flows out of flash vaporization chamber 1. This defined as the vapor operating pressure. However, the gap width must also be minimized so that the unvaporized TiCl$_4$ flow is not disturbed. The operating pressure of flash vaporization chamber 1 is between 950 and 1000 mm Hg. In the embodiment of our invention described herein, the TiCl$_4$ flow rate was approximately 2-18 grams per minute and the gap between inner surface 17 and outer surface 18 was approximately 0.040 inch, when utilizing between one and six burners. The TiCl$_4$ flow rate was preferably be 2-3 grams per minute per burner.

The vaporized TiCl$_4$ exits chamber 1 through outlet 9, travels the length of tube 13 and is intermixed with O$_2$ which is delivered via inlet 20. The O$_2$ and vaporized TiCl$_4$ is then delivered to mixer 11 to be intermixed with vaporized SiCl$_4$ from SiCl$_4$ delivery system.

The TiCl$_4$ delivery system uses pressurized gas to force liquid TiCl$_4$ out of TiCl$_4$ container 2. Spiking, i.e., very large surges/declines in pressure, has been observed where the pressurization gas provided by feed line 60 is used for extensive periods to pressurize the liquid TiCl$_4$ in TiCl$_4$ container 2. It is believed that this severely detrimental spiking phenomenon is caused by the saturation of O$_2$ in the liquid TiCl$_4$ during such extensive periods of pressurization. Saturated TiCl$_4$ is then delivered to flash vaporization chamber 1. As the TiCl$_4$ pressure is reduced during delivery the dissolved gas comes out of the saturated solution. The dissolved gas accumulates in the piping system forming bubbles which subsequently enter flash vaporization chamber 1.

We have invented a method and system of eliminating spikes, by preventing supersaturation of the pressurization gas in the liquid delivery system. The formation of bubbles in the liquid TiCl$_4$ before the flash vaporizer is eliminated by removing dissolved gas from saturated TiCl$_4$ stored within container 2. Feed line 50 delivers a sparging gas to container 2 to lower the dissolved gas concentrations within container 2. Thereafter the gases are released through container pressurization means 3 connected to the outlet to vent.

In our invention, the dissolved gas is forced out of the system while TiCl$_4$ delivery to flash vaporization chamber 1. First, the pressure on saturated liquid TiCl$_4$ is reduced by about 100 mm Hg less than the operating pressure of flash vaporization chamber 1, the pressure reduction causes supersaturation of liquid TiCl$_4$. Next a gas non reactive to liquid TiCl$_4$ is bubbled from feed line 50 through TiCl$_4$ container 2. This strips the dissolved gas out of the supersaturated solution by agitating the solution. The dissolved gas may also be stripped out of the supersaturated solution by stirring the supersaturated solution within TiCl$_4$ container 2. The pressure of TiCl$_4$ container 2 during the stripping operation must be less than the operating pressure of flash vaporization chamber 1; the operating pressure of flash vaporization chamber 1 should not be reduced to less than about 850 millimeters during stripping process for an efficient stripping treatment.

A gas that is non-reactive to the liquid TiCl$_4$ to be vaporized in the system is flowed through flash vaporization chamber 1 by means of feed line 40 when vaporization is not in process in order to maintain a constant temperature within chamber 1 and thereby enables a steady-state to be reached faster once vaporization is begun. The temperature of inner surface 17 of heating element 6 is reduced as TiCl$_4$ flow begins because the liquid TiCl$_4$ would otherwise reduce the operating temperature of surface 17. A control loop within the system senses any temperature change and reacts to maintain a constant temperature on surface 17. At the end of the process, when TiCl$_4$ delivery is shut off, the temperature of surface 17 increases and the control loop senses the temperature increase and reacts to maintain a constant temperature for surface 17. To reduce the substantial length of time required by the aforementioned process, the non-reactive gas delivered through feed line 40 and outer tube 12 replaces TiCl$_4$ and reduces the control loop reaction time. Replacing TiCl$_4$ with a non-reactive gas during system idle minimizes tuning of the system control loops, as surface 17 of heating element 6 is maintained at a constant temperature and the control loop is not required to work under a variety of power requirements.

In an alternate embodiment, both inner surface 17 and outer surface 18 are tied into individual control loops. The individual control loop will sense any temperature change from the surface in which it is tied into and react to maintain a constant temperature on that surfaces.

From the foregoing description it will be evident that the system is not limited to doping an optical fiber with TiO$_2$. It is contemplated that other vaporized reactants may be delivered to an oxidation/flame hydrolysis glass soot deposition system utilizing the liquid delivery means and flash vaporization chamber 1. It should also be apparent that the system is not limited to deposition of outer cladding layer.

Although the preferred embodiment of the invention has been disclosed, it will be understood by those skilled in the art that various changes and modifications may be made thereto without departing from the true spirit and scope thereof as defined in the appended claims.

We claim:

1. A flash vaporizer system for delivering reactants to an oxidation/flame hydrolysis glass soot deposition system comprising:
   (a) liquid delivery means;
   (b) container means;
   (c) heating means for heating a liquid delivered thereto by said liquid delivery means to a temperature sufficient to vaporize said liquid to a predetermined vapor pressure;
   (d) said heating means comprising a surface upon which said liquid delivery means delivers liquid at a controlled flow rate to form a thin film;
   (e) means for controlling the temperature of said surface of said heating means to a temperature above the boiling point of said liquid and below the temperature where nucleate boiling of said liquid occurs, such that continuity of said thin film is achieved; and,
   (f) means for delivering the vaporized liquid to a vapor deposition site.

2. A flash vaporizer system according to claim 1 further comprising:
   (a) means for reducing the pressure within said container means to less than the operating pressure of said flash vaporizer; and,
   (b) means for stirring liquid within said container means prior to said liquid's delivery through said liquid delivery means.

3. A flash vaporizer according to claim 1 wherein said liquid is TiCl$_4$ and said controlling means maintains the temperature of said surface within the range of 137° C.-166° C.

4. A flash vaporizer system according to claim 1 further comprising:
   (a) means for reducing the pressure within said container means to less than the operating pressure of said flash vaporizer; and,
   (b) means for bubbling a non-reactive gas through said liquid container means prior to delivery of said liquid through said liquid delivery means.

5. A flash vaporizer for delivering reactants to an oxidation/flame hydrolysis glass soot deposition system comprising:
   (a) a flash vaporization chamber means defined by two opposing surfaces for encouraging vaporization of a liquid reactant introduced upon at least one of said surfaces;
   (b) liquid delivery means including means for controlling the flow of the liquid reactant, and further including means for introducing the liquid reactant upon said at least one of said surfaces such that there is a predetermined gap distance between the end of said introducing means and said at least one of said surfaces;

(c) means for controlling the temperature in said flash vaporization chamber means within the range from the boiling point of said liquid reactant to the temperature where nucleate boiling of said liquid occurs;

(d) wherein for a given flash vaporization chamber surface separation, said liquid delivery means and said temperature control means operate to allow the vapor to reach the vapor operating pressure within a reasonable time without allowing the disturbance of the unvaporized liquid within said chamber by the vapor flow.

6. A flash vaporizer according to claim 5 wherein said flash vaporization chamber comprises a rod inside a cylinder.

7. A flash vaporizer according to claim 5 wherein said flash vaporization chamber comprises flat plates.

8. A flash vaporizer according to claim 7 wherein at least one of said surfaces is heated.

9. A flash vaporizer according to claim 7 wherein both said surfaces are heated.

10. A flash vaporizer according to claim 5 wherein said flash vaporization chamber comprises sufficient space to allow vapor from at least one liquid from the class including $TiCl_4$, $POCl_3$, $AlBr_3$ and $(-SiO(CH_3)_2-)_4$ to escape from said flash vaporizer without disturbing said unvaporized liquid within said flash vaporization chamber.

11. A flash vaporizer according to claim 10 wherein said flash vaporization chamber comprises sufficient space to allow vaporized $TiCl_4$ to escape without disturbing the continuity of the unvaporized $TiCl_4$ thin film.

12. A flash vaporizer according to claim 11 wherein said liquid $TiCl_4$ within said flash vaporizer has a flow rate within a range of 2–18 grams per minute and said surfaces within said flash vaporization chamber are separated by a gap within a range of 0.030–0.10 inch.

13. A flash vaporizer according to claim 12 wherein said liquid $TiCl_4$ within said flash vaporization chamber has a maximum flow rate of 18 grams per minute and said surfaces within said flash vaporization chamber are separated by a gap of approximately 0.040 inch.

14. A flash vaporizer system according to claim 6 wherein said liquid delivery means includes liquid container means for said liquid reactant, and further comprising:

(a) means for reducing the pressure within said container means to less than the operating pressure of said flash vaporizer; and, (b) means for bubbling a non-reactive gas through said liquid container means prior to delivery of said liquid through said liquid delivery means.

15. A flash vaporizer system according to claim 5 wherein said liquid delivery means includes liquid container means for said liquid reactant, and further comprising;

(a) means for reducing the pressure within said container means to less than the operating pressure of said flash vaporizer; and, (b) means for stirring the liquid within said liquid container means prior to said liquids delivery through said liquid delivery means.

16. A flash vaporization chamber according to claim 11 further comprising means to flow a gas non-reactive to liquid $TiCl_4$ through said flash vaporization chamber.

17. A flash vaporizer system for delivering reactants to an oxidation/flame hydrolysis glass soot deposition system comprising:

(a) a flash vaporization chamber for vaporizing liquids at temperatures greater than about than 150° C.;

(b) liquid delivery means for delivering a substantially $O_2$-free liquid reactant to said flash vaporization chamber, including means for controlling the flow of the liquid reactant to the flash vaporization chamber;

(c) first reactant delivery means for delivering vaporized liquid from said flash vaporization chamber to a deposition reaction, whereby $O_2$ provided to the deposition reaction is combined with the vaporized liquid after the vaporized liquid exits said flash vaporization chamber.

18. A flash vaporizer system according to claim 17 wherein said liquid delivery means comprises a liquid delivery tube mounted coaxially within an inlet tube for delivering said liquid directly onto a heating surface as a thin film.

19. A flash vaporizer according to claim 18 wherein said liquid delivery tube has a diameter of less than 1/8th inch.

20. A flash vaporizer system according to claim 19 wherein said liquid delivery tube has a diameter of an 1/16th inch and said inlet tube has a diameter of $\frac{1}{4}$th inch.

21. A flash vaporizer system according to claim 20 wherein the gap between the end said liquid delivery tube and said heating surface is about 0.040 inch.

22. A flash vaporizer system according to claim 17 further comprising:

(a) oxygen delivery means comprising valve and flow measurement means for intermixing the vaporized liquid with oxygen after the vaporized liquid exits said flash vaporization chamber;

(b) second reactant delivery means for delivering a second vaporized reactant for intermixing with said oxygen and said vaporized liquid after said vaporized liquid exits said flash vaporization chamber.

23. A flash vaporizer system according to claim 22 further comprising means for delivering the intermixed gases to a burner.

24. A flash vaporizer system according to claim 17 wherein said liquid delivery means comprises:

(a) container means for said liquid;

(b) container pressurization means for controlling the container pressure at a constant level;

(c) pressure detection means connected to said liquid delivery means between said container and said flash vaporization chamber for sensing the pressure of said liquid a providing a control signal to said pressurization means in response thereto.

25. A flash vaporizer according to claim 17 wherein said liquid delivery means comprises:

(a) container means for said liquid;

(b) metering pump means coupled between said container and said flash vaporization chamber for delivery of said liquid at a controlled flow rate to said chamber.

26. A method for delivering reactants to an oxidation/flame hydrolysis glass soot deposition system comprising the steps of:

(a) supplying a reactant in liquid form in a pressurized container;

(b) providing a flash vaporization chamber adjacent said pressurized container;

(c) delivering said liquid reactant to said flash vaporization chamber at a controlled rate;

(d) forming a thin film of said liquid reactant onto a heating surface of said flash vaporization chamber;

(e) vaporizing said first liquid reactant at a temperature below the temperature where nucleate boiling of said liquid occurs; and, (f) delivering said vaporized reactant to a vapor deposition site.

27. A method according to claim 26 further comprising the step of providing a carrier gas for intermixing with said vaporized reactant after said vaporized reactant exits said flash vaporization chamber.

* * * * *

UNITED STATES PATENT AND TRADEMARK OFFICE
CERTIFICATE OF CORRECTION

PATENT NO. : 5,078,092

DATED : January 7, 1992

INVENTOR(S) : Antos et al.

It is certified that error appears in the above-identified patent and that said Letters Patent is hereby corrected as shown below:

Column 7:

In Claim 14, at line 1 thereof, delete "6" and insert therefor -- 5 --. (See the specification at page 14).

Column 8:

In Claim 17 at line 11 thereof, after "chamber" insert -- said liquid delivery means including a liquid delivery tube having one of its ends separated by a gap of a predetermined width from a heating surface of said flash vaporization chamber, whereby said liquid is delivered directly onto said heating surface as a uniform thin film --. (See the Amendment After Allowance, filed 9/11/91).

Delete Claim 18.

Renumber Claim "19" as Claim -- 18 --; and on line 1 thereof delete "18" and insert therefor -- 17 --.

Renumber Claim "20" as Claim -- 19 --; and on line 1 thereof

UNITED STATES PATENT AND TRADEMARK OFFICE
CERTIFICATE OF CORRECTION

PATENT NO. : 5,078,092
DATED : January 7, 1992
INVENTOR(S) : Antos et al.

It is certified that error appears in the above-indentified patent and that said Letters Patent is hereby corrected as shown below:

Column 8:

delete "19" and insert therefor -- 18 --.

Renumber Claim "21" as Claim -- 20 --; and on line 1 thereof delete "20" and insert therefor -- 19 --.

Renumber Claim "22" as Claim -- 21 --.

Renumber Claim "23" as Claim -- 22 --; and on line 1 thereof delete "22" and insert therefor -- 21 --.

Renumber Claim "24" as Claim -- 23 --; and at line 9 thereof, after "liquid" delete "a" and insert therefor -- and --.

Renumber Claim "25" as Claim -- 24 --.

Renumber Claim "26" as Claim -- 25 --.

Renumber Claim "27" as Claim -- 26 --; and on line 1 thereof delete "26" and insert therefor -- 25 --.

Signed and Sealed this

Twentieth Day of September, 1994

Attest:

BRUCE LEHMAN

Attesting Officer     Commissioner of Patents and Trademarks